(12) United States Patent
Houston

(10) Patent No.: US 6,461,933 B2
(45) Date of Patent: Oct. 8, 2002

(54) SPIMOX/SIMOX COMBINATION WITH ITOX OPTION

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/005,863

(22) Filed: Nov. 8, 2001

(65) Prior Publication Data

US 2002/0086464 A1 Jul. 4, 2002

Related U.S. Application Data

(60) Provisional application No. 60/259,402, filed on Dec. 30, 2000.

(51) Int. Cl.$^7$ ............................................... H01L 21/76
(52) U.S. Cl. ........................ 438/423; 438/407; 438/404; 438/526; 438/528
(58) Field of Search ................................. 438/407, 423, 438/404, 526, 528

(56) References Cited

U.S. PATENT DOCUMENTS

| | | | | |
|---|---|---|---|---|
| 5,661,043 A | * | 8/1997 | Rissman et al. | 438/162 |
| 5,985,742 A | * | 11/1999 | Henley et al. | 438/515 |
| 6,083,324 A | * | 7/2000 | Henley et al. | 148/33.2 |
| 6,335,535 B1 | * | 1/2002 | Miyake et al. | 250/423 R |

FOREIGN PATENT DOCUMENTS

| | | | |
|---|---|---|---|
| EP | 0966034 | * | 12/1999 |
| WO | WO 99/06110 | * | 2/1999 |

\* cited by examiner

*Primary Examiner*—Trung Dang
(74) *Attorney, Agent, or Firm*—Jacqueline J. Garner; W. James Brady, III; Frederick J. Telecky, Jr.

(57) ABSTRACT

Beam implantation is combined with plasma implantation of oxygen, and possibly also internal thermal oxidation, to form a high quality buried oxide layer.

5 Claims, 3 Drawing Sheets

SPIMOX/SIMOX COMBINATION WITH ITOX OPTION

This application claims priority under 35 USC § 119(e)(1) of provisional application No. 60/259,402 filed Dec. 30, 2000.

BACKGROUND AND SUMMARY OF THE INVENTION

The present invention relates to integrated circuit structures and fabrication methods, and is more particularly applicable to formation of a buried oxide layer for silicon-on-insulator technologies.

BACKGROUND

Silicon on insulator (SOI) plays an important role in IC technology. SOI is used for low power, low voltage IC technology, and can be fabricated in a number of ways.

SIMOX is based on established ion implant technology. A silicon dioxide layer is formed by implanting oxygen through the top surface of a standard bulk wafer. Higher doses produce thicker layers as well as greater crystalline damage to the implanted surface. Because oxygen beam implantation typically is of much higher doses, long implant times are used. However, this decreases throughput, which forces device fabs to use higher beam currents which introduce contamination problems.

An alternative implantation method to manufacture SIMOX-like wafers uses Plasma Immersion Ion Implantation technology to implant oxygen. This process is called Separation by Plasma Implantation of Oxygen, and uses plasmas rather than ion beams to introduce ions in a material and form a buried oxide layer (BOX). This method has generally higher throughput since the entire wafer is implanted at once. However, this method generally introduces more than one species into the material, causing bimodal distributions and non-uniform BOX layers.

COMBINED BEAM AND PLASMA IMPLANTS

The present application discloses, as the preferred embodiment, an innovative method of forming a buried oxide layer (BOX) in a semiconductor material. The preferred embodiment uses a low dose oxygen implant using an ion beam, followed by an oxygen implant using a plasma implanting method. This combination can of course be supplemented with other process steps, such as an anneal between the two implants or after them.

The BOX layer created by the low dose beam implant is made of higher quality because the plasma implant adds oxygen ions, atoms, and molecules at a depth that allows any unoxidized silicon that remain in the BOX region after the beam implant to be oxidized. That is, the extra available oxygen will migrate to form a more uniform layer of stoichiometric SiO2 in the BOX region.

The innovative process can also include internal thermal oxidation with the beam implantation and/or the plasma implantation.

The innovations of the present application can be practiced in several process contexts, such as using anneals, rearranging the order of the beam and plasma implants, and adding any other necessary process steps.

Advantages of the disclosed methods and structures, in various embodiments, can include one or more of the following:

plasma implant is inexpensive supplement to low dose SIMOX for forming high quality BOX;

plasma implant adds oxygen to superficial silicon to prevent depletion of oxygen during BOX formation.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The innovative method of forming a BOX is described with reference to the figures. A beam implant is used to implant oxygen ions into a semiconductor. Typical beam implants using the SIMOX method are done at energies of about 200 KeV for central BOX depth of 400 nm. For BOX thickness of 380 nm, doses of about $1.7 \times 10^{18}$ O+/cm$^2$ are used. Lower BOX thicknesses use lower doses. For example, a BOX thickness of 120 nm requires a dose of $5.4 \times 10^{17}$ O+/cm$^2$. As those skilled in the art understand, the relation between dosage and BOX thicknesses is not linear: certain combinations of dose and energy have been found to give fairly uniform box, while intermediate doses do not give good results.

Methods of oxygen implantation are known in the art. For example, SIMOX, or separation by implantation of oxygen, uses ion beam implantation of oxygen. Beam implantation costs are reduced and throughput is increased for lower dosage implants. However, there are problems with low dosages that are alleviated by the innovative use of a plasma implant of oxygen along with a beam implant.

In the preferred embodiment, the SIMOX method using beam implantation of oxygen is used. Implantation by plasma as in SPIMOX (separation by plasma implantation of oxygen) follows to supplement the available oxygen for the BOX layer.

SPIMOX uses PIII (plasma immersion ion implantation) to implant oxygen. In a typical SPIMOX process, the target wafer is immersed in a plasma of either oxygen or water. A negative dc bias is applied which repels electrons and forms a positively charged sheath around the wafer. The positive ions are accelerated across this sheath and implanted in the wafer.

Combining beam implantation and plasma implantation allows for a low dose beam implant to be used. Lower dose beam implants often leave a high number of pinholes (unoxidized silicon threading through the BOX). Beam implants are expensive process steps to undertake, and adding a plasma implant allows for cheaper, lower dose beam implantation by providing extra oxygen to couple with the silicon in the BOX, increasing the quality of the BOX. In the preferred embodiment, a plasma implantation method is used as an inexpensive way to supplement the oxygen implants into a low dose beam implantation method.

Figure 1:
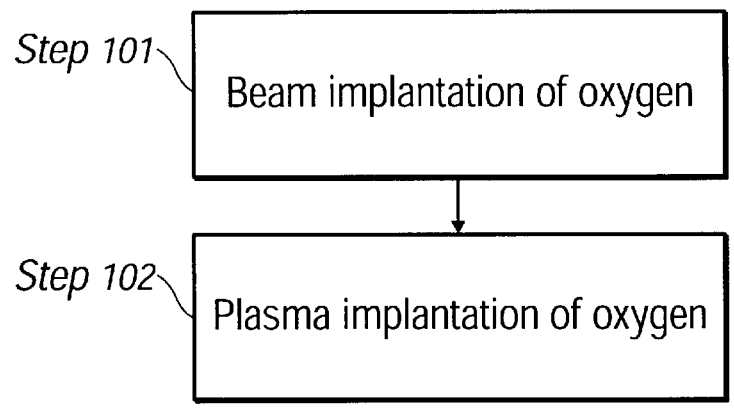
FIG. 1 shows a flow chart of an embodiment of the present application.

In FIG. 1, a process flowchart is shown for an embodiment of the present innovations. During the fabrication of the BOX, a beam implantation technique is used to implant oxygen into the wafer surface at the desired depth (step 101). There will of course be a distribution of oxygen in the substrate, with a maximum density at the desired depth of implantation. Next follows plasma implantation of oxygen into the same region of the substrate (step 102).

Since different species of oxygen (i.e., O, O2) may be implanted by the plasma implantation, this can produce bimodal distribution (in depth) of the implanted oxygen. In the preferred embodiment, the depth of the beam implanted oxygen should therefore be adjusted to a region between these depths, though this is not required. The depth can be set by adjusting the implantation energy and/or by adjusting the superficial Si thickness, either with an epitaxial layer or a sacrificial oxide in between the two types of implants. Other layers may be added as well, such as TEOS, nitride, or poly layers.

Figure 2:
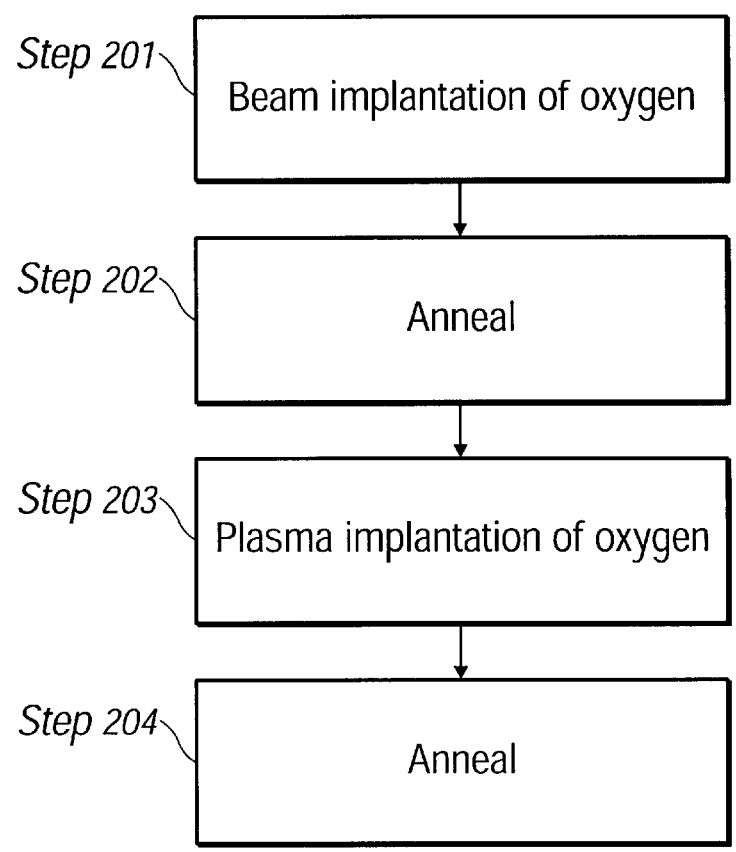
FIG. 2 is a flow chart showing alternative steps for the present innovations.

This process flow can be modified in many ways as contemplated by the present application. FIG. 2 shows a possible process flow incorporating additional steps. First the beam implantation is done (step 201), followed by an anneal (step 202), followed by the plasma implant (step 203). This step can then be followed by another anneal (step 204).

Figure 3:
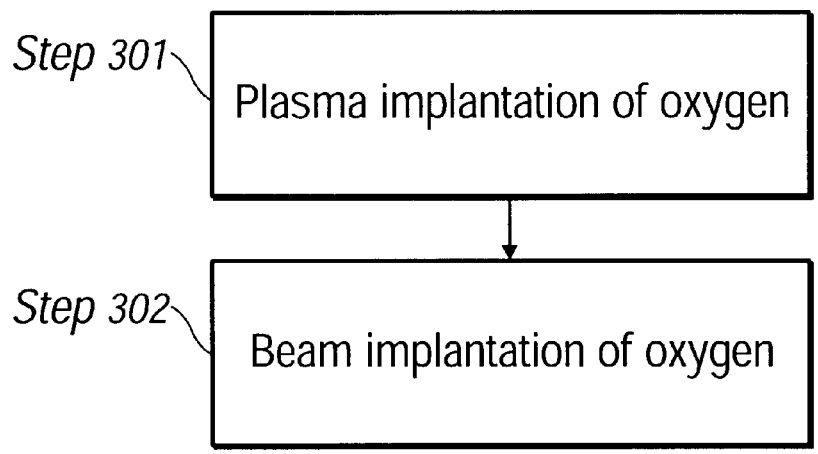
FIG. 3 is a flow chart showing alternative steps for the present innovations.

FIG. 3 shows yet another flow for the innovative process. First a plasma implant is used to implant oxygen into the substrate (step 301). This is followed by a beam implant aimed at a region near the depth of the plasma implanted oxygen (step 302). This flow can be altered, for instance, by the addition of annealing steps, either between the two implants, after them, or both.

The nucleation of oxide below the wafer surface depends on the oxygen concentration. In a pure SPIMOX, plasmas used for implantation are usually chosen to be single peaked at the depth of the desired BOX. This requires the plasma to be dominant in a single ion species, which in turn requires special process parameters like low pressure to maintain a collisionless sheath. Once nucleation begins, that region sinks nearby oxygen ions to form SiO2. This effect makes the present innovations attractive because the plasma implantation need not be single species (meaning both O and O2 may be implanted and process parameters loosened) when combined with a beam implant. This bimodal distribution is acceptable because the migration of oxygen during nucleation will cause the oxygen to be drawn to the depth of the beam implant, which in the preferred embodiment is of higher dose than the SPIMOX.

Figure 4A:
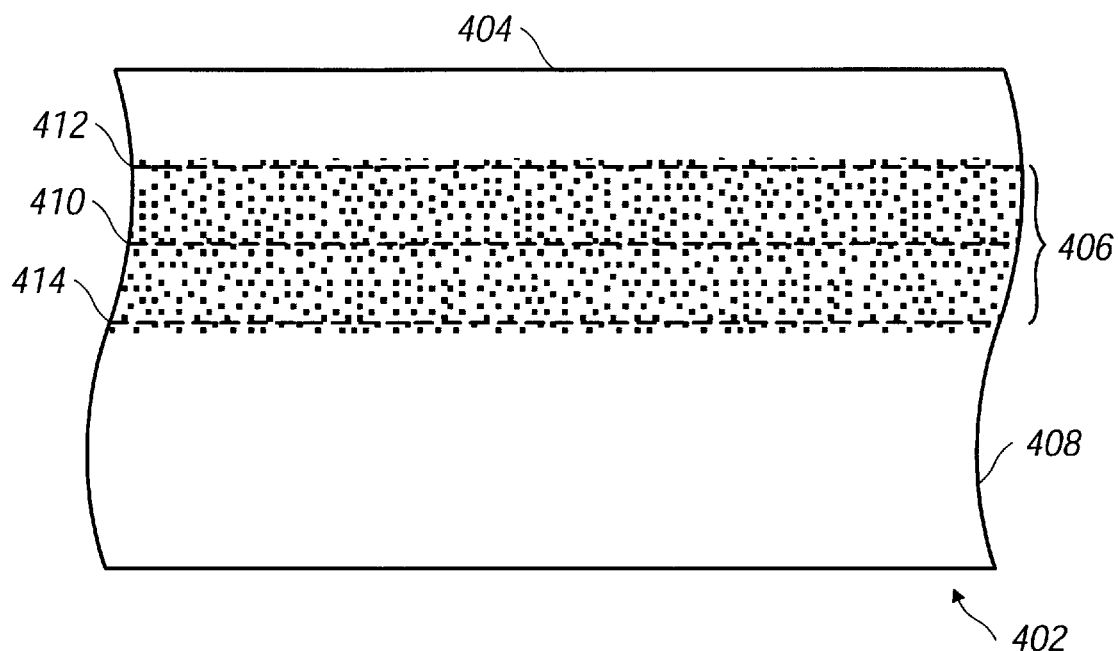
FIG. 4a shows a wafer substrate at a particular juncture during the innovative process.
Figure 4B:
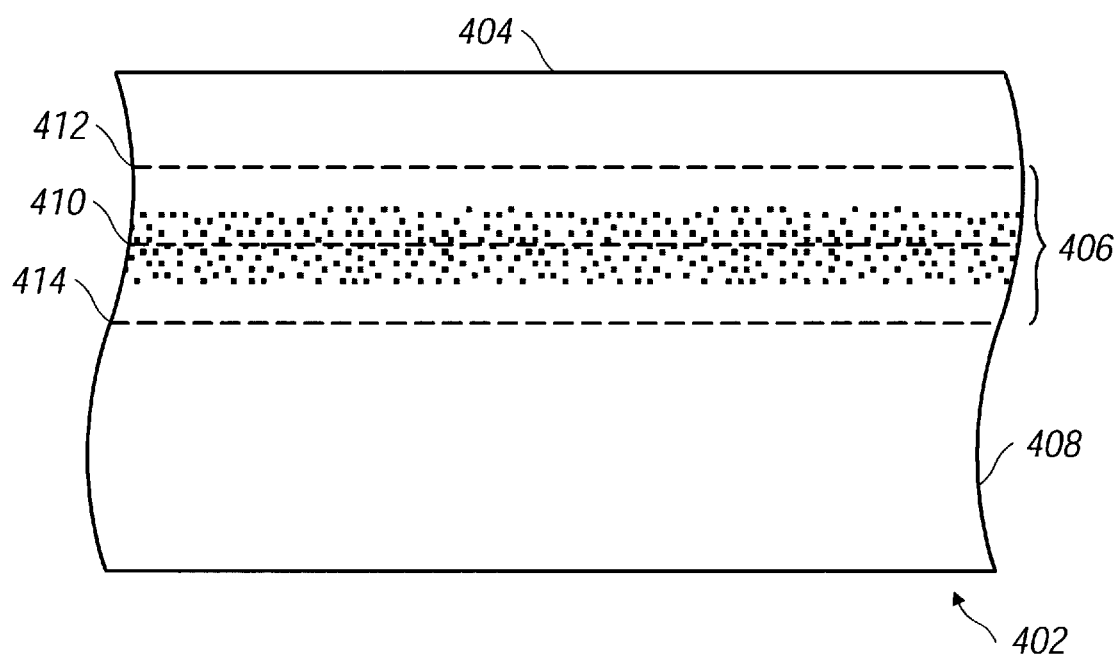
FIG. 4b shows a wafer substrate at a particular juncture during the innovative process.

This is shown in FIG. 4a. In this figure the wafer 402 is shown with the top layer of silicon 404, the implanted region 406, and the substrate 408. The depth of the beam implant 410 is between the implant depths of the two modes of oxygen implantation by plasma immersion 412, 414. In FIG. 4b, after an anneal, the oxygen added by the plasma immersion has diffused to the BOX.

The depths of the plasma and beam implants need not be exactly equal, as long as the overlap is sufficient to initiate the segregation process. During an anneal step, oxygen atoms in the silicon will migrate to a SiO2 region, building up and improving the quality of the BOX. The plasma, which generally has a less uniform implant profile and therefore broader implant density profile, does not therefore have to peak at exactly the implant peak.

In some applications, especially those with oxygen devoid epi as the top layer, oxygen is depleted from the BOX and migrates to the surrounding silicon regions. The disclosed innovative process would use SPIMOX to add oxygen to the superficial silicon, which could then diffuse into the box during a subsequent anneal or high temperature oxidation.

In another class of embodiments, a plasma implant is done after the low dose beam implant, but the oxygen during plasma implant does not penetrate significantly beyond the superficial silicon. Instead, the oxygen diffuses into the box during a subsequent high temperature anneal or oxidation.

Figure 5:
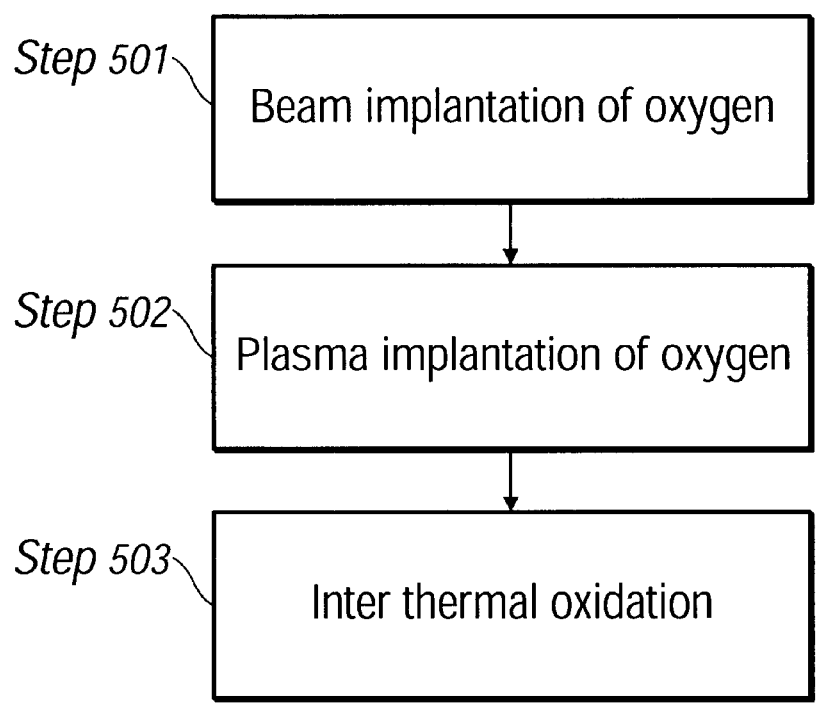
FIG. 5 shows an alternative process flow for the present innovations.

Another class of embodiments is shown in the flow chart of FIG. 5. A low dose beam implant (step 501) is followed by a plasma implant (step 502), followed by ITOX (internal thermal oxidation) (step 503). In ITOX, the top surface is oxidized and some oxygen penetrates into the BOX. During nucleation (or a subsequent anneal process) the oxygen closer to the surface of the wafer is drawn to the BOX. The plasma implant step ensures that there is enough oxygen near the BOX that the BOX is not depleted (which can occur if the oxygen is drawn to a nearby oxygen-depleted region, such as an epi).

In another class of embodiments, the disclosed innovations are adapted to a wafer-peeling process. (A conventional example of such a process is the SOITEC process.) Here the species introduced is hydrogen (or alternatively deuterium) rather than oxygen. Hydrogen exhibits a concentration-dependent segregation effect, as does oxygen, so it is expected that here too deep beam implantation can be advantageously combined with plasma implantation (and possibly also nearsurface sources) to accelerate formation of the desired deep phase. In the case of a wafer-peeling process, however, the desired deep phase is a porous composition which is mechanically weak enough to permit easy separation of the overlying monocrystalline semiconductor layer.

According to a disclosed class of innovative embodiments, there is provided: A process for fabricating thin monocrystalline semiconductor material, comprising the actions of: introducing a first species into a body of semiconductor material, using both plasma implanting and also beam implanting; and annealing said body of semiconductor material to thereby induce formation of a phase at approximately a desired depth within said semiconductor material, which causes electrical discontinuity between a layer of semiconductor material above said desired depth; and the remainder of said body.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

Additional general background, which help to show the knowledge of those skilled in the art regarding variations and implementations of the disclosed inventions, may be found in the following documents, all of which are hereby incorporated by reference: Colinge, *SILICON-ON-INSULATOR TECHNOLOGY; MATERIALS TO VLSI* (1991); Coburn, *PLASMA ETCHING AND REACTIVE ION ETCHING* (1982); *HANDBOOK OF PLASMA PROCESSING TECHNOLOGY* (ed. Rossnagel); *PLASMA ETCHING* (ed. Manos and Flamm 1989); *PLASMA PROCESSING* (ed. Dieleman et al. 1982); Schmitz, *CVD OF TUNGSTEN AND TUNGSTEN SILICIDES FOR VLSI/ULSI APPLICATIONS* (1992); *METALLIZATION AND METAL-SEMICONDUCTOR INTERFACES* (ed. Batra 1989); *VLSI METALLIZATION: PHYSICS AND TECHNOLOGIES* (ed. Shenai 1991); Murarka, *METALLIZATION THEORY AND PRACTICE FOR VLSI AND ULSI* (1993); *HANDBOOK OF MULTILEVEL METALLIZATION FOR INTEGRATED CIRCUITS* (ed. Wilson et al. 1993); Rao, *MULTILEVEL INTERCONNECT TECHNOLOGY* (1993); *CHEMICAL VAPOR DEPOSITION* (ed. M. L. Hitchman 1993); and the semiannual conference proceedings of the Electrochemical Society on plasma processing.

What is claimed is:

1. A process for fabricating thin monocrystalline semiconductor material, comprising the actions of:

introducing a first species into a body of semiconductor material, using both plasma implanting and also beam implanting; and annealing said body of semiconductor material to thereby induce formation of a phase at approximately a desired depth within said semiconductor material, which causes electrical discontinuity between a layer of semiconductor material above said desired depth; and the remainder of said body.

2. The process of claim 1, wherein said phase is a solid.

3. The process of claim 1, wherein said semiconductor material is silicon.

4. The process of claim 1, wherein said species is oxygen.

5. The process of claim 1, wherein said phase is an insulator.

* * * * *